(12) United States Patent
Lee et al.

(10) Patent No.: US 11,941,203 B2
(45) Date of Patent: Mar. 26, 2024

(54) ELECTRONIC DEVICE AND DRIVING METHOD OF ELECTRONIC DEVICE

(71) Applicant: Samsung Display Co., Ltd., Yongin-si (KR)

(72) Inventors: Jeongheon Lee, Yongin-si (KR); Soongyu Lee, Seoul (KR); Kyowon Ku, Seoul (KR); Junghak Kim, Hwaseong-si (KR); Hansu Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/964,702

(22) Filed: Oct. 12, 2022

(65) Prior Publication Data

US 2023/0214052 A1   Jul. 6, 2023

(30) Foreign Application Priority Data

Jan. 4, 2022   (KR) ........................ 10-2022-0000871

(51) Int. Cl.
*G06F 3/041*   (2006.01)
*G06F 3/044*   (2006.01)
*H10K 59/40*   (2023.01)

(52) U.S. Cl.
CPC ...... *G06F 3/04166* (2019.05); *G06F 3/04186* (2019.05); *G06F 3/0443* (2019.05); *G06F 3/0446* (2019.05); *H10K 59/40* (2023.02); *G06F 3/0412* (2013.01); *G06F 2203/04111* (2013.01)

(58) Field of Classification Search
None
See application file for complete search history.

(56) References Cited

U.S. PATENT DOCUMENTS 9,785,275 B2   10/2017   Fleck et al.
9,886,186 B2   2/2018   Durojaiye et al.

FOREIGN PATENT DOCUMENTS

KR   10-2017-0053709 A   5/2017
KR   10-2018-0118269 A   10/2018
WO   WO-2021081382 A1 *   4/2021   ............ B60L 53/122

\* cited by examiner

*Primary Examiner* — Duane N Taylor, Jr.
(74) *Attorney, Agent, or Firm* — Lewis Roca Rothgerber Christie LLP

(57) ABSTRACT

An electronic device includes: a display layer to display an image; a sensor layer on the display layer; and a sensor driver electrically connected with the sensor layer, and to be selectively driven in a first mode for detecting a passive input, or a second mode for detecting an active input. In the second mode, the sensor driver is to: receive a plurality of sensing signals from the sensor layer; divide the plurality of sensing signals into a valid signal and a noise signal; calculate intermediate coordinates based on the valid signal; and correct the intermediate coordinates based on the noise signal to calculate input coordinates.

20 Claims, 15 Drawing Sheets

ELECTRONIC DEVICE AND DRIVING METHOD OF ELECTRONIC DEVICE

CROSS-REFERENCE TO RELATED APPLICATION

This application claims priority to and the benefit of Korean Patent Application No. 10-2022-0000871, filed on Jan. 4, 2022, in the Korean Intellectual Property Office, the entire disclosure of which is incorporated by reference herein.

BACKGROUND

1. Field

Aspects of embodiments of the present disclosure relate to an electronic device having improved accuracy for detecting a position of an active input, and a driving method of the electronic device.

2. Description of the Related Art

Multimedia electronic devices, such as a television, a portable phone, a tablet computer, a navigation system, a game console, and the like, each includes a display device for displaying an image. Other than a general input scheme, such as a button, a keyboard, a mouse, or the like, an electronic device may include a sensor layer (e.g., an input sensor) capable of providing a touch-based input scheme, which allows a user to enter information or commands easily, intuitively, and conveniently.

The input sensor may sense a touch or pressure from the body (e.g., a finger) of the user. Meanwhile, there is an increasing demand for employing a pen for a fine touch input for a user who is accustomed to entering information by using writing instruments, or for an application program (e.g. an application program for sketching or drawing).

The above information disclosed in this Background section is for enhancement of understanding of the background of the present disclosure, and therefore, it may contain information that does not constitute prior art.

SUMMARY

One or more embodiments of the present disclosure are directed to an electronic device having improved accuracy for detecting a position of an active input.

One or more embodiments of the present disclosure are directed to a driving method of an electronic device having improved accuracy for detecting a position of an active input.

According to one or more embodiments of the present disclosure, an electronic device includes: a display layer configured to display an image; a sensor layer on the display layer; and a sensor driver electrically connected with the sensor layer, and configured to be selectively driven in a first mode for detecting a passive input, or a second mode for detecting an active input. In the second mode, the sensor driver is configured to: receive a plurality of sensing signals from the sensor layer; divide the plurality of sensing signals into a valid signal and a noise signal; calculate intermediate coordinates based on the valid signal; and correct the intermediate coordinates based on the noise signal to calculate input coordinates.

In an embodiment, the sensor driver may include: an analog-to-digital (AD) converter configured to sample each of the plurality of sensing signals at a sampling frequency to obtain sampling values.

In an embodiment, the sensor driver may further include: a change data calculator configured to obtain pieces of change data of the sampling values in the second mode; a comparator configured to compare a comparison target value of the pieces of change data of each of the plurality of sensing signals with a threshold, and divide the plurality of sensing signals into the valid signal and the noise signal; an intermediate coordinate calculator configured to calculate the intermediate coordinates based on the valid signal; and a coordinate corrector configured to correct the intermediate coordinates based on the noise signal to calculate the input coordinates.

In an embodiment, each of the pieces of change data may correspond to a difference between one sampling value and a previous sampling value prior to the one sampling value.

In an embodiment, the plurality of sensing signals may include a first sensing signal and a second sensing signal, the comparator may be configured to determine the first sensing signal as the valid signal when a maximum value of the pieces of change data of the first sensing signal is greater than or equal to the threshold, and the comparator may be configured to determine the second sensing signal as the noise signal when a maximum value of the pieces of change data of the second sensing signal is less than the threshold.

In an embodiment, the plurality of sensing signals may include a first sensing signal and a second sensing signal, the comparator may be configured to determine the first sensing signal as the valid signal when an average value of the pieces of change data of the first sensing signal is greater than or equal to the threshold, and the comparator may be configured to determine the second sensing signal as the noise signal when an average value of the pieces of change data of the second sensing signal is less than the threshold.

In an embodiment, the plurality of sensing signals may include a first sensing signal and a second sensing signal, the comparator may be configured to determine the first sensing signal as the valid signal when a root mean square of the pieces of change data of the first sensing signal is greater than or equal to the threshold, and the comparator may be configured to determine the second sensing signal as the noise signal when a root mean square of the pieces of change data of the second sensing signal is less than the threshold.

In an embodiment, the sensor driver may further include: a mode determiner configured to determine a driving mode of the sensor driver between the first mode and the second mode; and a sampling frequency converter configured to change the sampling frequency from a reference sampling frequency to a selection sampling frequency higher than the reference sampling frequency, when the sensor driver is driven in the second mode.

In an embodiment, the sampling frequency may be a reference sampling frequency in the first mode, and the sampling frequency may be a selection sampling frequency higher than the reference sampling frequency in the second mode.

In an embodiment, the sampling frequency may be a selection sampling frequency in the first mode, and the sampling frequency may be the same as the selection sampling frequency in the second mode.

In an embodiment, the sensor layer may include a plurality of cross electrodes extending along a first direction, and a plurality of electrodes extending along a second direction crossing the first direction, and the sensor driver may be configured to: detect the passive input by means of a change in mutual capacitance formed between the plurality of electrodes and the plurality of cross electrodes in the first mode; and detect the active input by means of a change in capacitance of at least one of the plurality of electrodes and the plurality of cross electrodes in the second mode.

According to one or more embodiments of the present disclosure, an electronic device includes: a sensor layer including a plurality of cross electrodes extending along a first direction, and a plurality of electrodes extending along a second direction crossing the first direction; and a sensor driver electrically connected with the sensor layer. The sensor driver is configured to: receive a plurality of sensing signals from the plurality of electrodes and the plurality of cross electrodes; sample each of the plurality of sensing signals at a selection sampling frequency higher than a reference sampling frequency to obtain sampling values; divide the plurality of sensing signals into a valid signal and a noise signal based on pieces of change data calculated by a difference between sampling values adjacent to each other from among the sampling values; and calculate intermediate coordinates based on the valid signal.

In an embodiment, the sensor driver may be configured to: compare a comparison target value of any one of a maximum value, an average value, or a root mean square of the pieces of change data with a threshold; determine a sensing signal corresponding to the pieces of change data from among the plurality of sensing signals as the valid signal when the comparison target value is greater than or equal to the threshold; and determine the sensing signal as the noise signal when the comparison target value is less than a threshold.

In an embodiment, the sensor driver may be configured to correct the intermediate coordinates based on the noise signal to calculate input coordinates.

In an embodiment, the sensor driver may be configured to be selectively driven in a first mode for detecting a passive input, or a second mode for detecting an active input, and the reference sampling frequency may be a sampling frequency in the first mode, and the selection sampling frequency may be the sampling frequency in the second mode.

In an embodiment, the sensor driver may be configured to: detect the passive input by means of a change in mutual capacitance formed between the plurality of electrodes and the plurality of cross electrodes in the first mode; and detect the active input by means of a change in capacitance of each of the plurality of electrodes and the plurality of cross electrodes in the second mode.

In an embodiment, the sensor driver may be configured to be selectively driven in a first mode for detecting a passive input, or a second mode for detecting an active input, and the selection sampling frequency may be a sampling frequency in the first mode and the second mode.

According to one or more embodiments of the present disclosure, a driving method of an electronic device includes: receiving a plurality of sensing signals from a sensor layer including a plurality of cross electrodes extending along a first direction, and a plurality of electrodes extending along a second direction crossing the first direction; sampling each of the plurality of sensing signals at a selection sampling frequency higher than a reference sampling frequency to obtain a plurality of sampling values; comparing sampling values adjacent to each other from among the plurality of sampling values to calculate a plurality of pieces of change data; comparing a comparison target value derived from the plurality of pieces of change data with a threshold, and dividing the plurality of sensing signals into a valid signal and a noise signal; calculating intermediate coordinates based on the valid signal; and correcting the intermediate coordinates based on the noise signal to calculate input coordinates.

In an embodiment, the method may further include: determining a driving mode between a first mode for detecting a passive input, and a second mode for detecting an active mode. The sensor layer: may receive a plurality of first mode sensing signals from the plurality of electrodes or the plurality of cross electrodes when the sensor layer operates in the first mode; may sample the plurality of first mode sensing signals at the reference sampling frequency; and may calculate first mode input coordinates according to the passive input based on the sampled plurality of first mode sensing signals.

In an embodiment, the method may further include: up-converting the reference sampling frequency into the selection sampling frequency when the sensor layer operates in the second mode.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
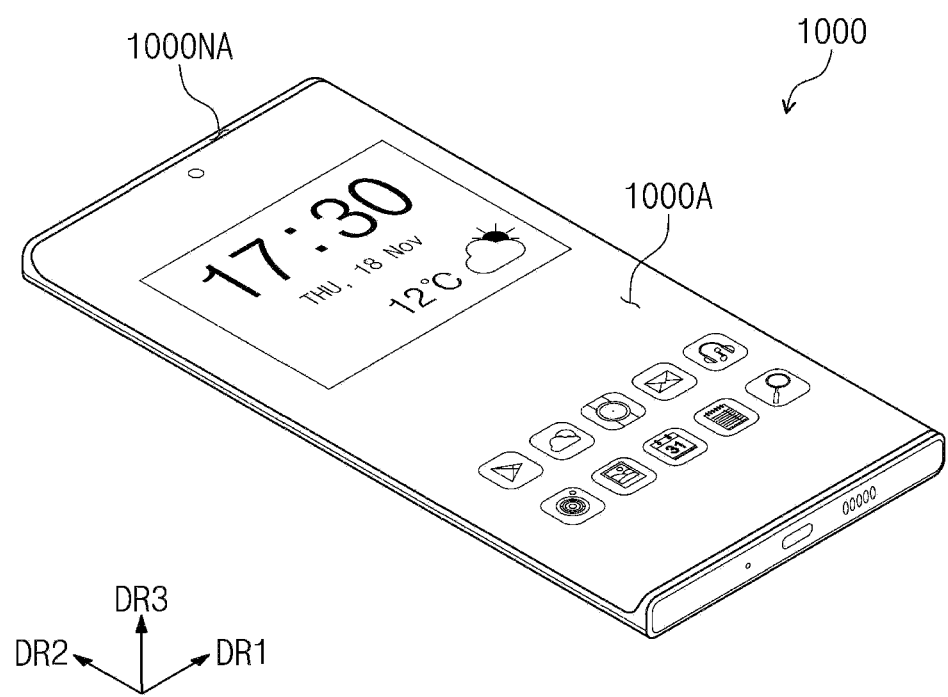
FIG. 1 is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Similarly, as used herein, the terms "part" and "unit" may refer to a software component or a hardware component for performing a specific function. The hardware component may include, for example, a field-programmable gate array (FPGA) or an application-specific integrated circuit (ASIC). The software component may refer to data used by an executable code and/or an executable code in an addressable storage medium. Thus, the software components may be, for example, object-oriented software components, class components, and/or task components, and may include processes, functions, attributes, procedures, subroutines, program code segments, drivers, firmware, microcode, circuits, data, databases, data structures, tables, arrays, or variables.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of an electronic device 1000 according to an embodiment of the present disclosure.

Referring to FIG. 1, the electronic device 1000 may be a device activated according to an electrical signal. For example, the electronic device 1000 may be, but is not limited to, a mobile phone, a foldable mobile phone, a laptop, a television, a tablet, a car navigation system, a game console, a wearable device, and/or the like. FIG. 1 illustrates that the electronic device 1000 is a mobile phone, as an example.

An active area 1000A and a non-active area 1000NA may be defined in the electronic device 1000. The electronic device 1000 may display an image on the active area 1000A. The active area 1000A may include a surface defined by a first direction DR1, and a second direction DR2 crossing the first direction. The non-active area 1000NA may surround (e.g., around a periphery of) the active area 1000A.

A thickness direction of the electronic device 1000 may be parallel to or substantially parallel to a third direction DR3 crossing the first direction DR1 and the second direction DR2. Thus, front surfaces (e.g., upper surfaces) and rear surfaces (e.g., lower surfaces) of components, elements, or members of the electronic device 1000 may be defined with respect to the third direction DR3.

FIG. 1 illustrates a bar type electronic device 1000, but the present disclosure is not limited thereto. For example, while the electronic device 1000 may be described in more detail hereinafter in the context of the bar type mobile phone, the present disclosure is not limited to the bar type mobile phone shown in FIG. 1, and the description below may be applicable to various suitable electronic devices, such as a foldable electronic device, a rollable electronic device, or a slidable electronic device.

Figure 2:
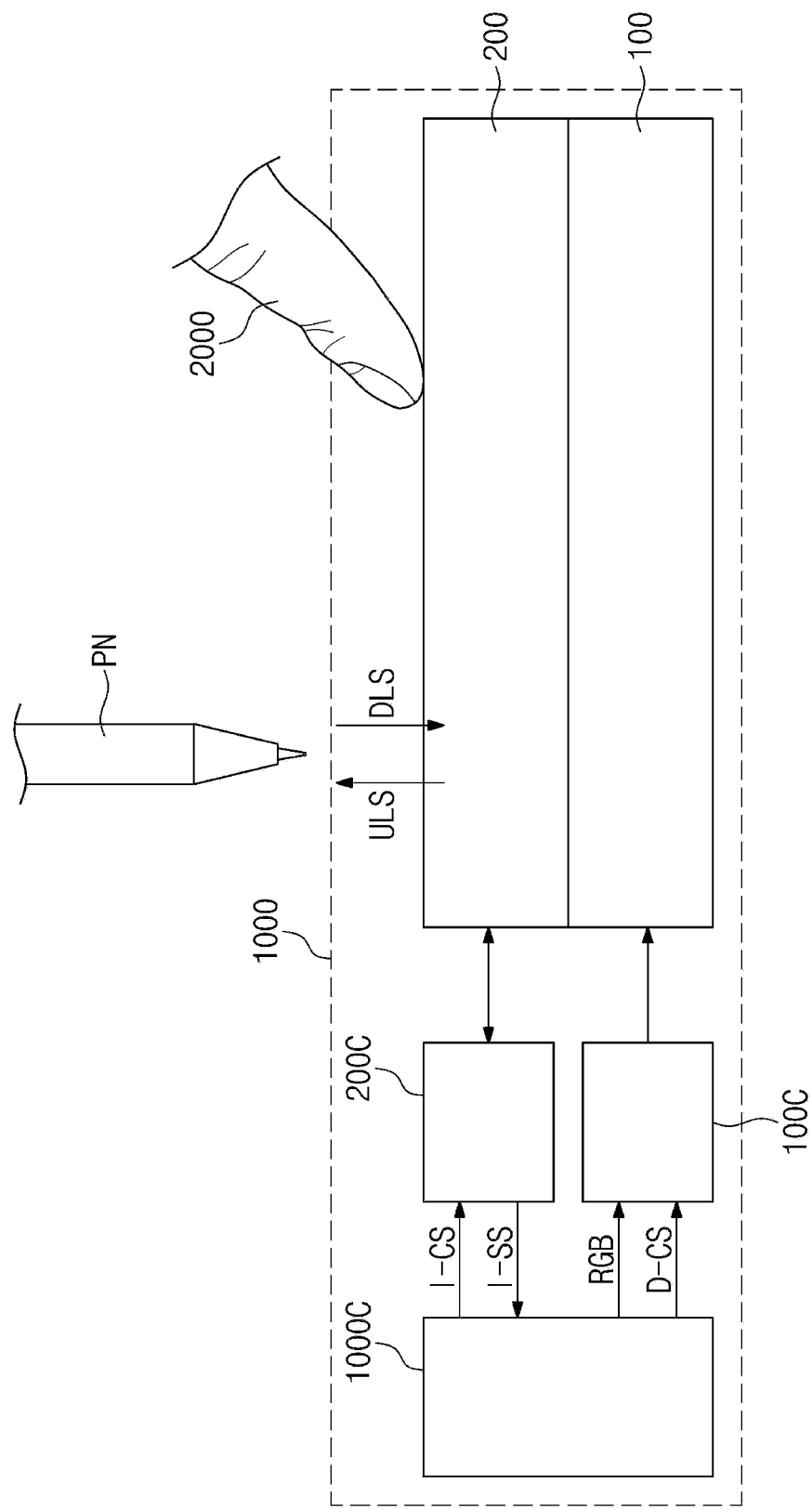
FIG. 2 illustrates an operation of an electronic device according to an embodiment of the present disclosure.

FIG. 2 illustrates an operation of an electronic device 1000 according to an embodiment of the present disclosure.

Referring to FIG. 2, the electronic device 1000 may include a display layer 100, a sensor layer 200, a display driving unit (e.g., a display driver) 100C, a sensor driving unit (e.g., a sensor driver) 200C, and a main driving unit (e.g., a main driver) 1000C. The display layer 100 may be referred to as a display panel, and the sensor layer 200 may be referred to as a sensor panel or a sensor.

The display layer 100 may be a component that generates or substantially generates an image. The display layer 100 may be a light emitting display layer. For example, the display layer 100 may be an organic light emitting display layer, an inorganic light emitting display layer, an organic-inorganic display layer, a quantum dot display layer, a micro-LED display layer, or a nano-LED display layer.

The sensor layer 200 may be disposed on the display layer 100. The sensor layer 200 may sense external inputs of a touch 2000 and an input device PN applied from the outside. The external inputs may include all suitable inputs means capable of providing a change in a capacitance. For example, the sensor layer 200 may sense all of an active input by the input device PN and a passive input by the touch 2000. The input device PN may be an active type of input means that provides a driving signal, for example, such as an active pen. The touch 2000 may include all of various suitable passive inputs by any suitable input means capable of providing a change in capacitance, for example, such as a user's body (e.g., finger) or a passive pen.

The sensor layer 200 and the input device PN may perform bidirectional communications with each other. The sensor layer 200 may provide an uplink signal ULS to the input device PN, and the input device PN may provide a downlink signal DLS to the sensor layer 200. For example, the uplink signal ULS may include, but is not particularly to, various suitable information, such as panel information and/or a protocol version. The downlink signal DLS may include a synchronization signal and/or state information of the input device PN. For example, the downlink signal may include, but is not particularly limited to, various suitable information about coordinates of the input device PN, information about a battery (e.g., a battery state) of the input device PN, information about a slope of the input device PN, various pieces of information stored in the input device PN, and/or the like.

The main driving unit 1000C may control the overall operation of the electronic device 1000. For example, the main driving unit 1000C may control operations of the display driving unit 100C and the sensor driving unit 200C. The main driving unit 1000C may include at least one microprocessor. The main driving unit 1000C may be referred to as a host. The main driving unit 1000C may further include a graphics controller.

The display driving unit 100C may drive the display layer 100. The display driving unit 100C may receive image data RGB and a control signal D-CS from the main driving unit 1000C. The control signal D-CS may include various suitable signals. For example, the control signal D-CS may include an input vertical synchronization signal, an input horizontal synchronization signal, a main clock, and a data enable signal. The display driving unit 100C may generate a vertical synchronization signal and a horizontal synchronization signal, based on the control signal D-CS, for controlling a timing for providing a signal to the display layer 100.

The sensor driving unit 200C may control the sensor layer 200. The sensor driving unit 200C may receive a control signal I-CS from the main driving unit 1000C. The control signal I-CS may include a mode determination signal for determining a driving mode of the sensor driving unit 200C, and/or a clock signal.

The sensor driving unit 200C may calculate information about coordinates of an input based on the signal received from the sensor layer 200, and may provide the main driving unit 1000C with a coordinate signal I-SS having the coordinate information. The main driving unit 1000C may execute an operation corresponding to a user's input based on the coordinate signal I-SS. For example, the main driving unit 1000C may operate the display driving unit 100C, such that a new application image is displayed on the display layer 100, based on the coordinate signal I-SS. As another example, the main driving unit 1000C may operate the display driving unit 100C, such that a trajectory image corresponding to the coordinate signal I-SS is displayed.

Figure 3A:
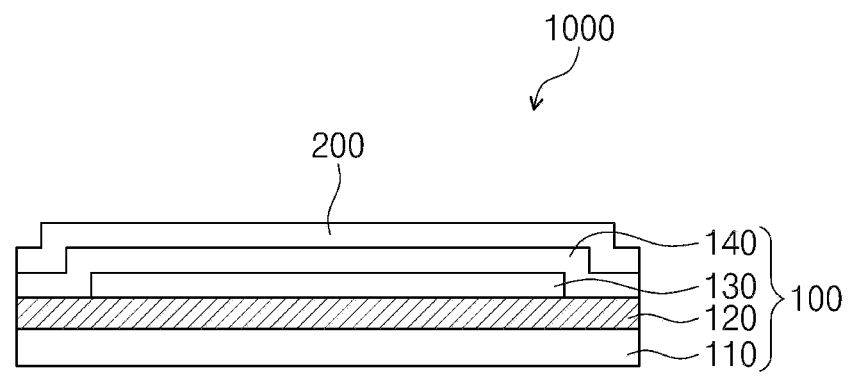
FIG. 3A is a cross-sectional view of an electronic device according to an embodiment of the present disclosure.
Figure 3A:
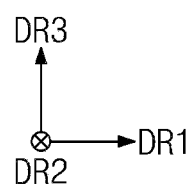

FIG. 3A is a cross-sectional view of an electronic device 1000 according to an embodiment of the present disclosure.

Referring to FIG. 3A, a display layer 100 may include a base layer 110, a circuit layer 120, a light emitting element layer 130, and an encapsulation layer 140.

The base layer 110 may be a member that provides a base surface on which the circuit layer 120 is disposed. The base layer 110 may be a glass substrate, a metal substrate, a polymer substrate, or the like. However, the present disclosure is not limited thereto, and the base layer 110 may be an inorganic layer, an organic layer, or a composite material layer.

The circuit layer 120 may be disposed on the base layer 110. The circuit layer 120 may include an insulating layer, a semiconductor pattern, a conductive pattern, a signal line, and the like. An insulating layer, a semiconductor layer, and a conductive layer may be formed on the base layer 110 by a suitable scheme or method, such as coating or deposition, and the insulating layer, the semiconductor layer, and the conductive layer may then be selectively patterned through a plurality of photolithography processes. Thereafter, the semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and/or foreign substances, such as dust particles.

The sensor layer 200 may be disposed on the display layer 100. The sensor layer 200 may sense an external input applied from the outside. The external input may be a user input. The user input may include various suitable kinds of external inputs, such as a part of the user's body, a pen, light, heat, pressure, and/or the like.

The sensor layer 200 may be formed on the display layer 100 through a continuous process. In this case, the sensor layer 200 may be understood as being directly disposed on the display layer 100. Here, the phrase "directly disposed" may mean that a third component is not disposed between the sensor layer 200 and the display layer 100. In other words, a separate adhesive member may not be disposed between the sensor layer 200 and the display layer 100. As another example, the sensor layer 200 may be coupled to (e.g., connected to or attached to) the display layer 100 by means of an adhesive member. The adhesive member may include a typical adhesive or sticking agent.

In some embodiments, the electronic device 1000 may further include an anti-reflection layer and an optical layer, which may be disposed on the sensor layer 200. The anti-reflection layer may reduce a reflectivity of external light incident from the outside of the electronic device 1000. The optical layer may improve a front luminance of the electronic device 1000 by controlling a direction of light incident from the display layer 100.

Figure 3B:
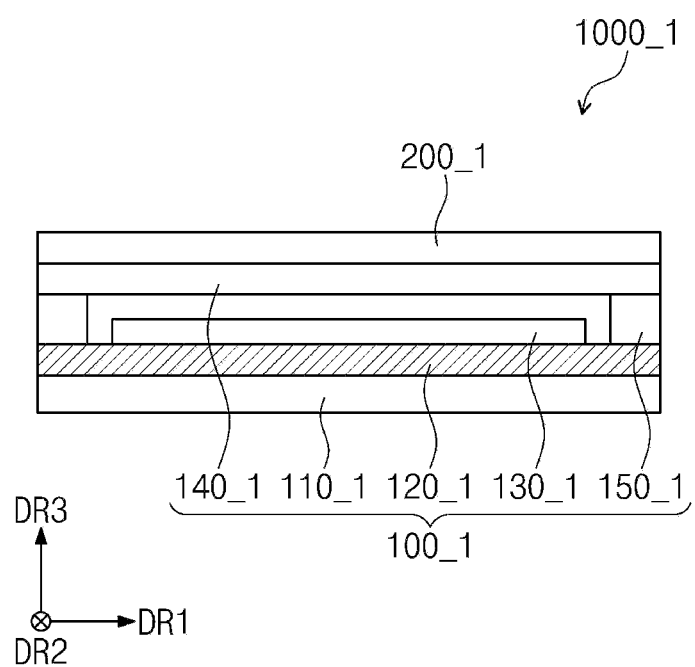
FIG. 3B is a cross-sectional view of an electronic device according to an embodiment of the present disclosure.
Figure 3B:
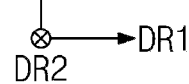

FIG. 3B is a cross-sectional view of an electronic device 1000_1 according to an embodiment of the present disclosure.

Referring to FIG. 3B, the electronic device 1000_1 may include a display layer 100_1 and a sensor layer 200_1. The display layer 100_1 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may be, but is not particularly limited to, a glass substrate, a metal substrate, a polymer substrate, or the like.

The coupling member 150_1 may be disposed between the base substrate 110_1 and the encapsulation substrate 140_1. The coupling member 150_1 may couple (e.g., may connect or attach) the encapsulation substrate 140_1 to the base substrate 110_1 or the circuit layer 120_1. The coupling member 150_1 may include an inorganic material or an organic material. For example, the inorganic material may include a frit seal, and the organic material may include a photo-curable resin or a photo-plastic resin. However, the material of the coupling member 150_1 is not limited to the above examples.

The sensor layer 200_1 may be directly disposed on the encapsulation substrate 140_1. The phrase "directly disposed" may mean that a third component is not disposed between the sensor layer 200_1 and the encapsulation substrate 140_1. In other words, a separate adhesive member may not be disposed between the sensor layer 200_1 and the display layer 100_1. However, the present disclosure is not limited thereto, and an adhesive layer may be further disposed between the sensor layer 200_1 and the encapsulation substrate 140_1.

Figure 4:
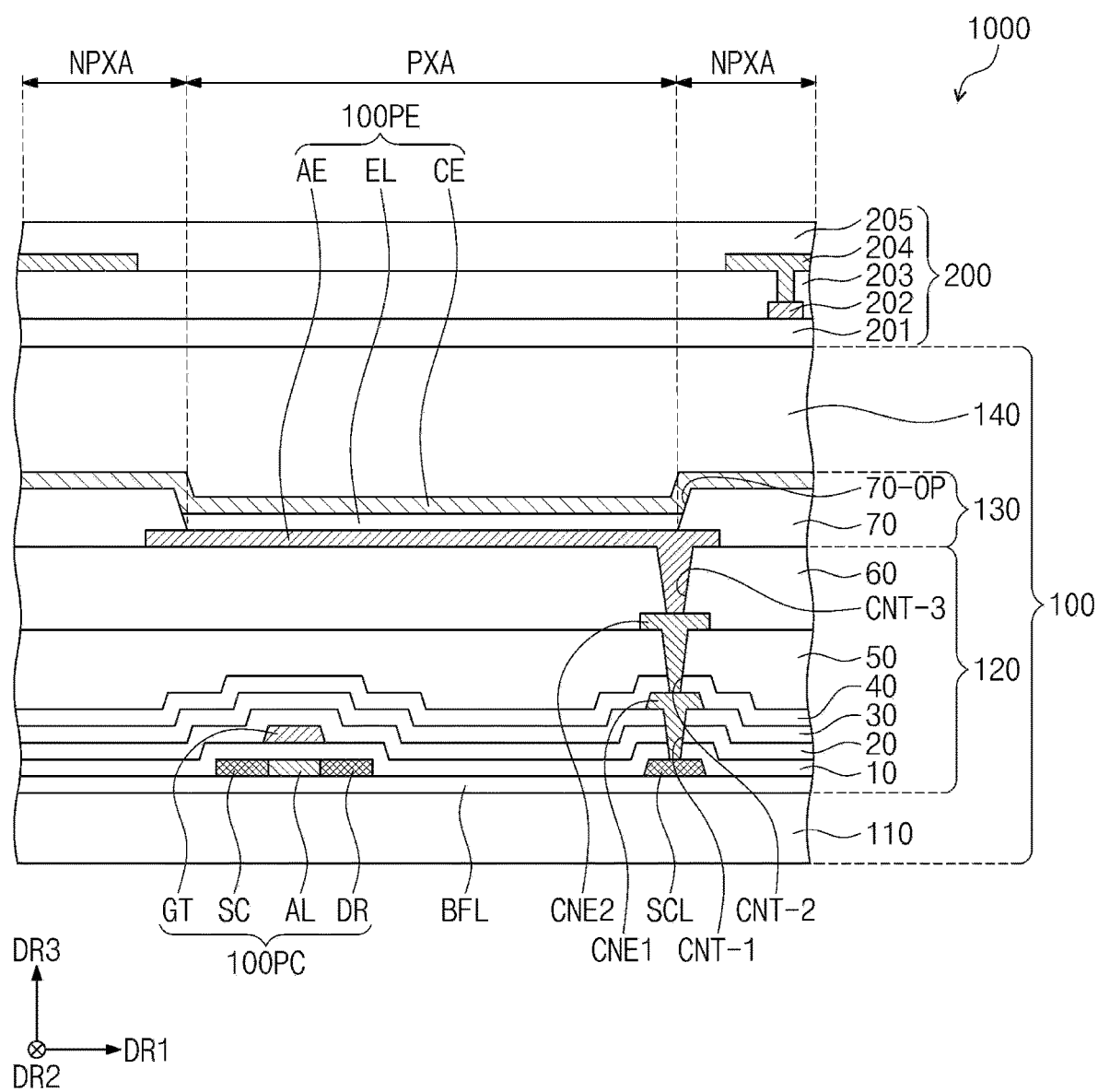
FIG. 4 is a cross-sectional view of an electronic device according to an embodiment of the present disclosure.

FIG. 4 is a cross-sectional view of an electronic device 1000 according to an embodiment of the present disclosure.

Referring to FIG. 4, at least one inorganic layer may be formed on an upper surface of a base layer 110. The inorganic layer may include at least one of aluminum oxide, titanium oxide, silicon oxide, silicon nitride, silicon oxynitride, zirconium oxide, and hafnium oxide. The inorganic layer may be formed of multiple suitable layers. The multiple inorganic layers may constitute a barrier layer and/or a buffer layer. In an embodiment, a display layer 100 is illustrated as including a buffer layer BFL.

The buffer layer BFL may improve a bonding force between the base layer 110 and a semiconductor pattern. The buffer layer BFL may include at least one of silicon oxide, silicon nitride, and silicon oxynitride. For example, the buffer layer BFL may include a structure in which a silicon oxide layer and a silicon nitride layer are alternately laminated.

The semiconductor pattern may be disposed on the buffer layer BFL. The semiconductor pattern may include polysilicon. However, the present disclosure is not limited thereto, and the semiconductor pattern may include amorphous silicon, low-temperature polycrystalline silicon, or an oxide semiconductor.

FIG. 4 illustrates a portion of the semiconductor pattern, and the semiconductor pattern may be further disposed at (e.g., in or on) another area. Semiconductor patterns may be arranged across pixels in a suitable rule (e.g., a specific or predetermined rule). An electrical property of the semiconductor pattern may vary depending on whether it is doped or not. The semiconductor pattern may include a first area having high conductivity, and a second area having low conductivity. The first area may be doped with an N-type dopant or a P-type dopant. A P-type transistor may include a doping area doped with the P-type dopant, and an N-type transistor may include a doping area doped with the N-type dopant. The second area may be a non-doping area, or may be an area doped with a concentration lower than that of the first area.

The first area may be greater in conductivity than that of the second area, and may serve or substantially serve as an electrode or a signal line. The second area may correspond to or substantially correspond to an active (e.g., a channel) of a transistor. In other words, a portion of the semiconductor pattern may be an active of the transistor, another portion thereof may be a source or a drain of the transistor, and another portion thereof may be a connection electrode or a connection signal line.

A plurality of pixels may each have an equivalent circuit including seven transistors, one capacitor, and a light emitting element, but the equivalent circuit of the pixel may be variously modified as needed or desired, as would be understood by those having ordinary skill in the art. One transistor 100PC and one light emitting element 100PE included in the pixel are illustrated as an example in FIG. 4.

A source area SC, an active area AL, and a drain area DR of the transistor 100PC may be formed from the semiconductor pattern. The source area SC and the drain area DR may extend in directions opposite to each other from the active area AL in a cross-sectional view. A portion of a connection signal line SCL formed from the semiconductor pattern is illustrated in FIG. 4. Although not separately illustrated, the connection signal wire SCL may be connected with the drain area DR of the transistor 100PC in a plan view.

A first insulating layer 10 may be disposed on the buffer layer BFL. The first insulating layer 10 may overlap with a plurality of pixels in common, and may cover the semiconductor pattern. The first insulating layer 10 may be an inorganic layer and/or an organic layer, and may have a single-layer structure or a multi-layered structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 may be a single silicon oxide layer. An insulating layer of the circuit layer 120, which will be described in more detail below, as well as the first insulating layer 10, may be an inorganic layer and/or an organic layer, and may have a single-layer structure or a multi-layered structure. The inorganic layer may include, but is not limited to, at least one of the inorganic materials described above.

A gate GT of the transistor 100PC is disposed on the first insulating layer 10. The gate GT may be a portion of a metal pattern. The gate GT overlaps with the active area AL. The gate GT may function as a mask in a process of doping the semiconductor pattern.

A second insulating layer 20 may be disposed on the first insulating layer 10, and may cover the gate GT. The second insulating layer 20 may overlap with the pixels in common. The second insulating layer 20 may be an inorganic layer and/or an organic layer, and may have a single-layer structure or a multi-layered structure. The second insulating layer 20 may include at least one of silicon oxide, silicon nitride, and silicon oxynitride. In an embodiment, the second insulating layer 20 may have a multi-layered structure including a silicon oxide layer and a silicon nitride layer.

A third insulating layer 30 may be disposed on the second insulating layer 20. The third insulating layer 30 may have a single-layer structure or a multi-layered structure. For example, the third insulating layer 30 may have a multi-layered structure including a silicon oxide layer and a silicon nitride layer.

A first connection electrode CNE1 may be disposed on the third insulating layer 30. The first connection electrode CNE1 may be connected with the connection signal line SCL through a contact hole CNT-1 penetrating the first, second, and third insulating layers 10, 20, and 30.

A fourth insulating layer 40 may be disposed on the third insulating layer 30. The fourth insulating layer 40 may be a single silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected with the first connection electrode CNE1 through a contact hole CNT-2 penetrating the fourth insulating layer 40 and the fifth insulating layer 50.

A sixth insulating layer 60 may be disposed on the fifth insulating layer 50, and may cover the second connection electrode CNE2. The sixth insulating layer 60 may be an organic layer.

The light emitting element layer 130 may be disposed on the circuit layer 120. The light emitting element layer 130 may include a light emitting element 100PE. For example, the light emitting element layer 130 may include an organic light emitting material, an inorganic light emitting material, an organic-inorganic light emitting material, a quantum dot, a quantum rod, a micro-LED, or a nano-LED. Hereinafter, the light emitting element 100PE will be described in more detail in the context of an organic light emitting element, but the present disclosure is not particularly limited thereto.

The light emitting device 100PE may include a first electrode AE, a light emitting layer EL, and a second electrode CE.

The first electrode AE may be disposed on the sixth insulating layer 60. The first electrode AE may be connected with the second connection electrode CNE2 through a contact hole CNT-3 penetrating the sixth insulating layer 60.

A pixel definition layer 70 may be disposed on the sixth insulating layer 60, and may cover a portion of the first electrode AE. An opening 70-OP may be defined in the pixel definition layer 70. The opening 70-OP of the pixel definition layer 70 may expose at least a portion of the first electrode AE.

An active area 1000A (e.g., refer to FIG. 1) may include a light emitting area PXA, and a non-light emitting area NPXA adjacent to the light emitting area PXA. The non-light emitting area NPXA may surround (e.g., around a periphery of) the light emitting area PXA. In an embodiment, the light emitting area PXA is defined to correspond to a partial area of the first electrode AE, which is exposed by the opening 70-OP.

The light emitting layer EL may be disposed on the first electrode AE. The light emitting layer EL may be disposed in an area corresponding to the opening 70-OP. In other words, the light emitting layer EL may be separately disposed for each of the pixels. When the light emitting layer EL is separately disposed for each of the pixels, each of the light emitting layers EL may emit light of at least one of a blue color, a red color, and a green color. However, the present disclosure is not limited thereto. For example, in some embodiments, the light emitting layer EL may be connected with the pixels to be provided in common. In this case, the light emitting layer EL may provide blue light, or may provide white light.

The second electrode CE may be disposed on the light emitting layer EL. The second electrode CE may have an integral shape, and may be disposed in common for a plurality of pixels.

In some embodiments, a hole control layer may be disposed between the first electrode AE and the light emitting layer EL. The hole control layer may be disposed in common at (e.g., in or on) the light emitting area PXA and the non-light emitting area NPXA. The hole control layer may include a hole transport layer, and may further include a hole injection layer. An electron control layer may be disposed between the light emitting layer EL and the second electrode CE. The electron control layer may include an electron transport layer, and may further include an electron injection layer. The hole control layer and the electron control layer may be formed in common for the plurality of pixels using an open mask.

The encapsulation layer 140 may be disposed on the light emitting element layer 130. The encapsulation layer 140 may include an inorganic layer, an organic layer, and an inorganic layer that are sequentially laminated, but the layers constituting the encapsulation layer 140 are not limited thereto. The inorganic layers may protect the light emitting element layer 130 from moisture and oxygen, and the organic layer may protect the light emitting element layer 130 from foreign substances, such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

A sensor layer 200 may include a base layer 201, a first conductive layer 202, a sensing insulating layer 203, a second conductive layer 204, and a cover insulating layer 205.

The base layer 201 may be an inorganic layer including at least any one of silicon nitride, silicon oxynitride, and silicon oxide. As another example, the base layer 201 may be an organic layer including an epoxy resin, an acrylate resin, or an imide-based resin. The base layer 201 may have a single-layer structure or may have a multi-layered structure laminated along a third direction DR3.

Each of the first conductive layer 202 and the second conductive layer 204 may have a single-layer structure or may have a multi-layered structure laminated along the third direction DR3.

A conductive layer of a single-layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include a conductive polymer such as PEDOT, a metal nanowire, graphene, or the like.

The conductive layer of the multi-layered structure may include a plurality of metal layers. The metal layers may have, for example, a three-layered structure of titanium/aluminum/titanium. The conductive layer of the multi-layered structure may include at least one metal layer, and at least one transparent conductive layer.

At least one of any of the sensing insulating layer 203 and the cover insulating layer 205 may include an inorganic layer. The inorganic layer may include at least one of aluminum oxide, titanium oxide, silicon oxide, silicon nitride, silicon oxynitride, zirconium oxide, and hafnium oxide.

At least one of any of the sensing insulating layer 203 and the cover insulating layer 205 may include an organic layer. The organic layer may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 5:
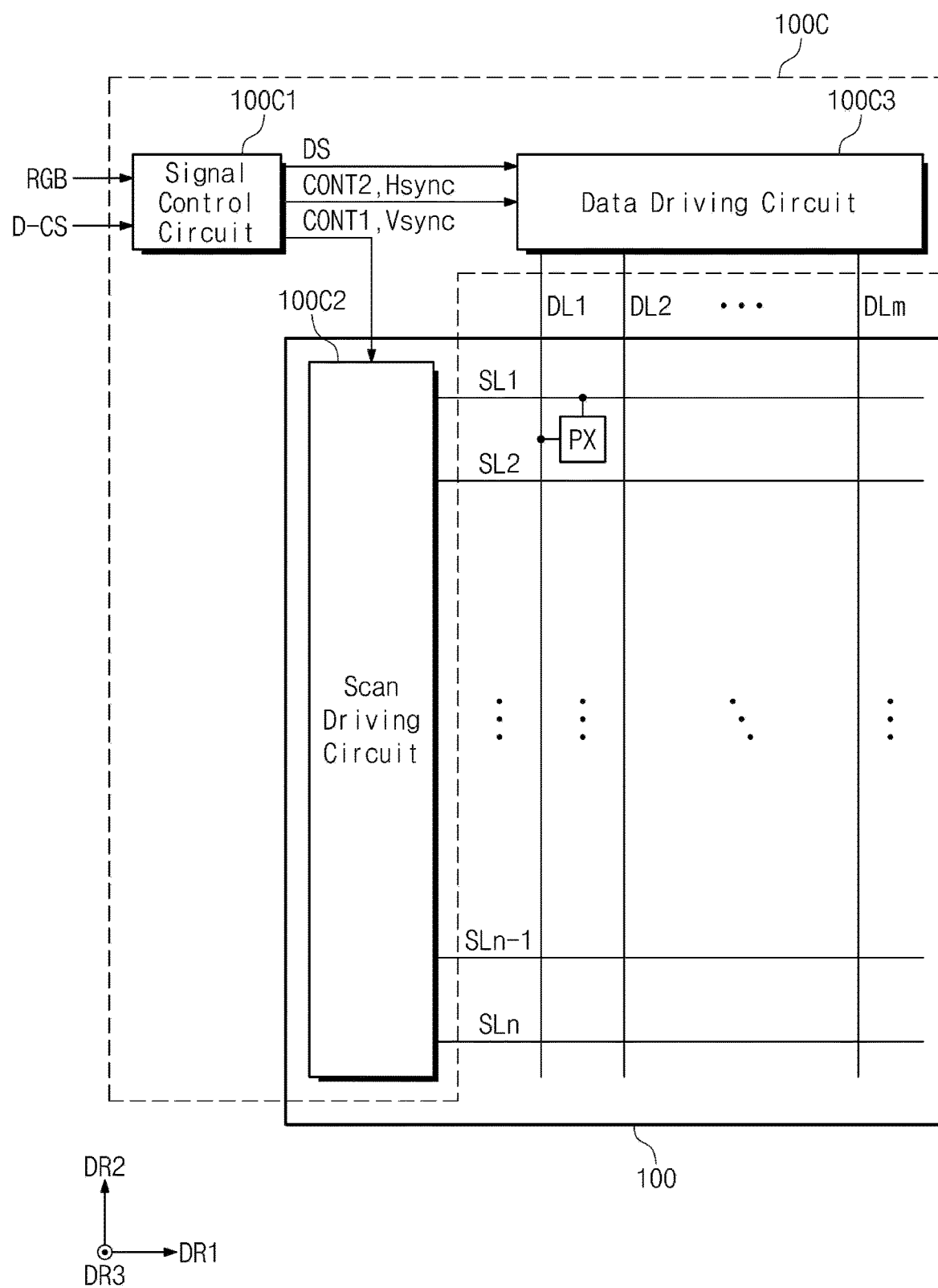
FIG. 5 is a block diagram of a display layer and a display driving unit according to an embodiment of the present disclosure.

FIG. 5 is a block diagram of a display layer 100 and a display driving unit (e.g., a display driver) 100C according to an embodiment of the present disclosure.

Referring to FIG. 5, the display layer 100 may include a plurality of scan lines SL1-SLn, a plurality of data lines DL1-DLm, and a plurality of pixels PX, where n and m are natural numbers. Each of the plurality of pixels PX may be connected with a corresponding data line from among the plurality of data lines DL1-DLm, and may be connected with a corresponding scan line from among the plurality of scan lines SL1-SLn. In an embodiment of the present disclosure, the display layer 100 may further include light emitting control lines, and the display driving unit 100C may further include a light emitting driving circuit, which provides control signals to the light emitting control lines. However, the configuration of the display layer 100 is not particularly limited thereto.

Each of the plurality of scan lines SL1-SLn may extend along a first direction DR1, and the plurality of scan lines SL1-SLn may be arranged to be spaced apart from each other in a second direction DR2. Each of the plurality of data lines DL1-DLm may extend along the second direction DR2, and the plurality of data lines DL1-DLm may be arranged to be spaced apart from each other in the first direction DR1.

The display driving unit 100C may include a signal control circuit 100C1, a scan driving circuit 100C2, and a data driving circuit 100C3.

The signal control circuit 100C1 may receive image data RGB and a control signal D-CS from a main control unit 1000C (e.g., refer to FIG. 2). The control signal D-CS may include various suitable signals. For example, the control signal D-CS may include an input vertical synchronization signal, an input horizontal synchronization signal, a main clock, and a data enable signal.

The signal control circuit 100C1 may generate a first control signal CONT1 and a vertical synchronization signal Vsync based on the control signal D-CS, and may output the first control signal CONT1 and the vertical synchronization signal Vsync to the scan driving circuit 100C2.

The signal control circuit 100C1 may generate a second control signal CONT2 and a horizontal synchronization signal Hsync based on the control signal D-CS, and may output the second control signal CONT2 and the horizontal synchronization signal Hsync to the data driving circuit 100C3.

Further, the signal control circuit 100C1 may output a driving signal DS, which is obtained by processing the image data RGB to suit an operation condition of the display panel 100, to the data driving circuit 100C3. The first control signal CONT1 and the second control signal CONT2 may be signals used for the operations of the scan driving circuit 100C2 and the data driving circuit 100C3, which are not particularly limited.

The scan driving circuit 100C2 may drive the plurality of scan lines SL1-SLn in response to the first control signal CONT1 and the vertical synchronization signal Vsync. In an embodiment of the present disclosure, the scan driving circuit 100C2 may be formed in the same or substantially the same process as that of the circuit layer 120 (e.g., refer to FIG. 4) in the display layer 100, but is not particularly limited thereto. For example, the scan driving circuit 100C2 may be implemented as an integrated circuit (IC), which may be directly mounted on a suitable area (e.g., a certain or predetermined area) of the display layer 100, or may be mounted on a separate printed circuit board in a chip on film (COF) manner to be electrically connected with the display layer 100.

The data driving circuit 100C3 may output a gray scale voltage to the plurality of data lines DL1-DLm in response to the second control signal CONT2, the horizontal synchronization signal Hsync, and the driving signal DS from the signal control circuit 100C1. The data driving circuit 100C3 may be implemented as an IC, and may be directly mounted on a suitable area (e.g., a certain or predetermined area) of the display layer 100, or may be mounted on a separate printed circuit board in a COF manner to be electrically connected with the display layer 100, but is not particularly limited thereto. For example, the data driving circuit 100C3 may be formed in the same or substantially the same process as that of the circuit layer 120 (e.g., refer to FIG. 4) in the display layer 100.

Figure 6:
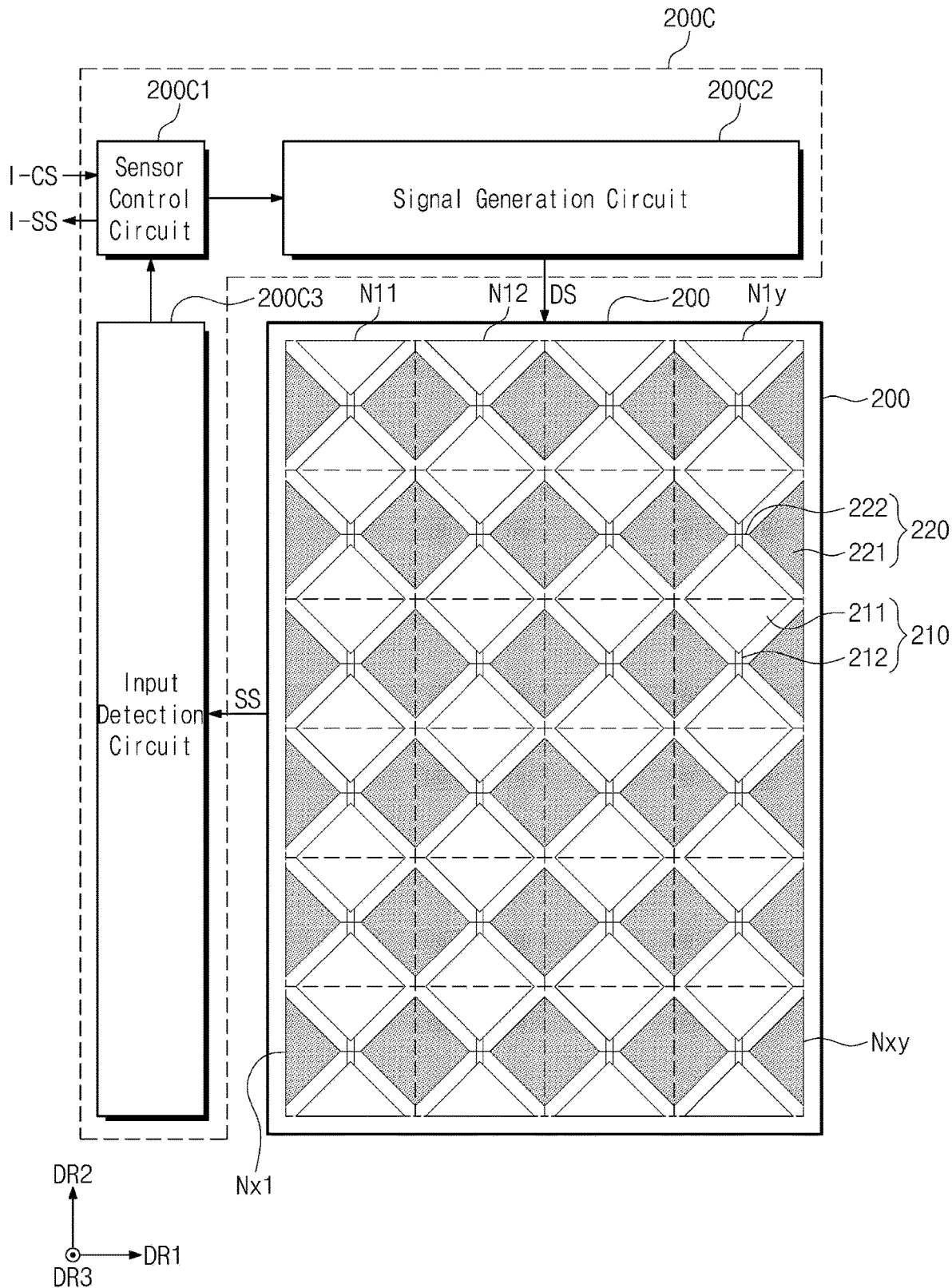
FIG. 6 is a block diagram of a sensor layer and a sensor driving unit according to an embodiment of the present disclosure.

FIG. 6 is a block diagram of a sensor layer 200 and a sensor driving unit (e.g., a sensor driver) 200C according to an embodiment of the present disclosure.

Referring to FIG. 6, the sensor layer 200 may include a plurality of electrodes 210 and a plurality of cross electrodes 220. The plurality of electrodes 210 may be arranged along a first direction DR1, and each of the plurality of electrodes 210 may extend along a second direction DR2. The plurality of cross electrodes 220 may be arranged along the second direction DR2, and each of the plurality of cross electrodes 220 may extend along the first direction DR1. The plurality of electrodes 210 may cross the plurality of cross electrodes 220. The sensor layer 200 may further include a plurality of signal lines connected with the plurality of electrodes 210 and the plurality of cross electrodes 220.

Each of the electrodes 210 may include a sensing pattern 211 and a bridge pattern 212. Although two sensing patterns 211 that are adjacent to each other may be electrically connected with each other by two bridge patterns 212, the present disclosure is not particularly limited thereto. The sensing pattern 211 may be included in a second conductive layer 204, and the bridge pattern 212 may be included in a first conductive layer 202 (e.g., refer to FIG. 4).

Each of the plurality of cross electrodes 220 may include a first portion 221 and a second portion 222. The first portion 221 and the second portion 222 may have an integrated shape, and may be arranged at (e.g., in or on) the same layer as each other. For example, the first portion 221 and the second portion 222 may be included in the second conductive layer 204 (e.g., refer to FIG. 4). The two bridge patterns 212 may be insulated from the second portion 222 to cross the second portion 222.

A sensor driving unit (e.g., a sensor driver) 200C may receive a control signal I-CS from a main driving unit 1000C (e.g., refer to FIG. 2), and may provide a coordinate signal I-SS to the main driving unit 1000C.

The sensor driving unit 200C may be implemented as an integrated circuit (IC), which may be directly mounted on a suitable area (e.g., a certain or predetermined area) of the sensor layer 200, or may be mounted on a separate printed circuit board in a chip on film (COF) manner to be electrically connected with the sensor layer 200.

The sensor driving unit 200C may include a sensor control circuit 200C1, a signal generation circuit 200C2, and an input detection circuit 200C3. The sensor control circuit 200C1 may control operations of the signal generation circuit 200C2 and the input detection circuit 200C3 based on the control signal I-CS.

The sensor driving unit 200C may be selectively driven in a first mode for detecting a passive input, or a second mode for detecting an active input. In the first mode, the signal generation circuit 200C2 may sequentially output the driving signal DS to the sensor layer 200, for example, such as to the cross electrodes 220. The input detection circuit 200C3 may receive sensing signals SS from the sensor layer 200. For example, the input detection circuit 200C3 may receive the sensing signals SS from the electrodes 210. In an embodiment of the present disclosure, the signal generation circuit 200C2 may sequentially output the driving signal DS to the electrodes 210, and the input detection circuit 200C3 may receive the sensing signals SS from the cross electrodes 220. In the second mode, the input detection circuit 200C3 may receive the sensing signals SS from the electrodes 210 and the cross electrodes 220.

Nodes N11 to Nxy are illustrated in FIG. 6, where x and y are natural numbers. Each of the nodes N11 to Nxy may be defined at (e.g., in or on) an area where one electrode 210 of the plurality of electrodes 210 and one cross electrode 220 of the plurality of cross electrodes 220 cross each other. FIG. 6 illustrates that four nodes N11 and N12 to N1y are arranged along the first direction DR1, and that sixth nodes N11 to Nx1 are arranged along the second direction DR2. However, the number of the nodes N11 to Nxy is not limited thereto. The number of the nodes N11 to Nxy may be more or less than those shown in FIG. 6.

Figure 7:
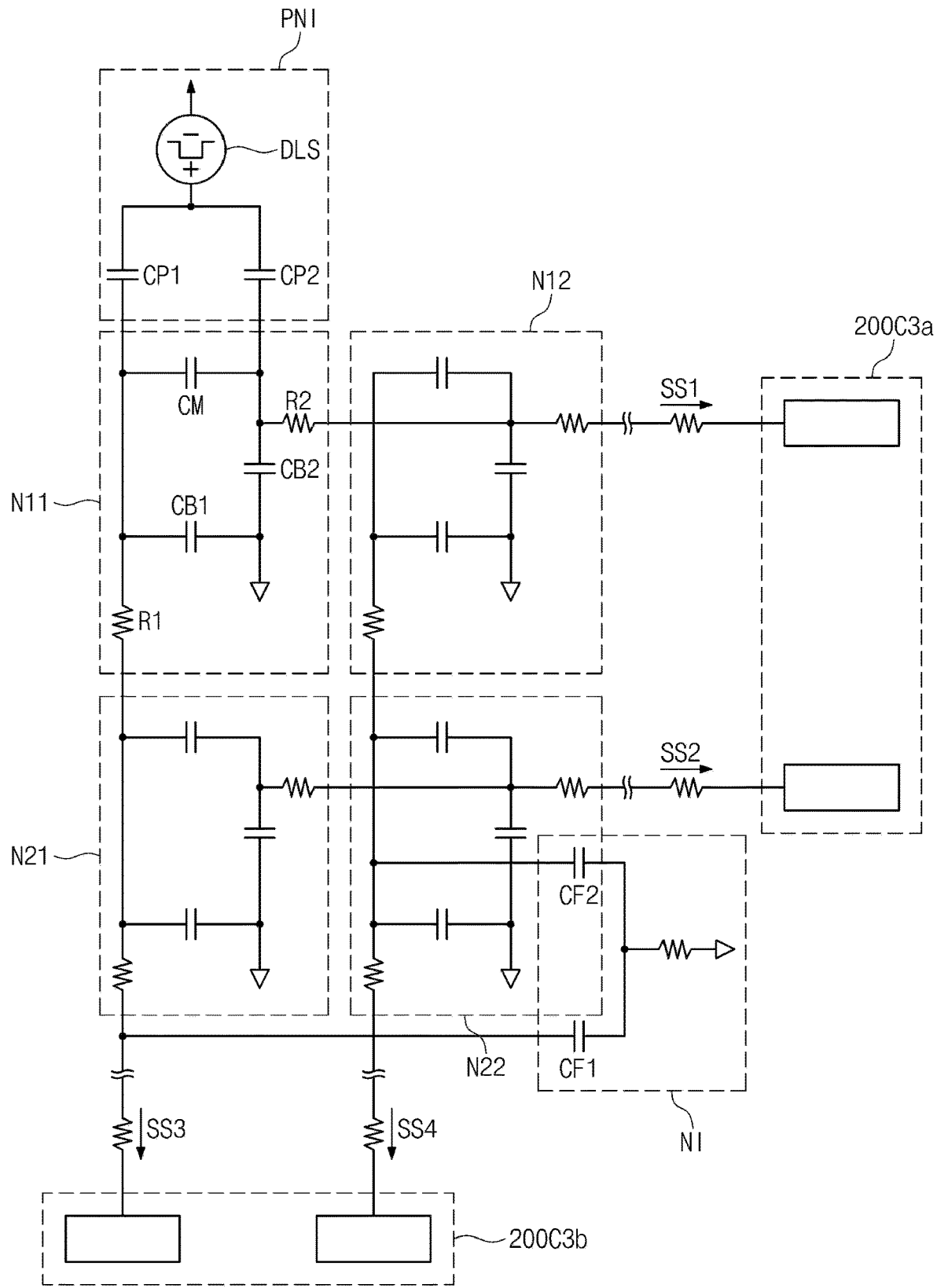
FIG. 7 is an equivalent circuit diagram of a portion of a sensor layer according to an embodiment of the present disclosure.

FIG. 7 is an equivalent circuit diagram of a portion of a sensor layer 200 according to an embodiment of the present disclosure.

Referring to FIGS. 6 and 7, an equivalent circuit of four nodes N11, N12, N21, and N22, and first and second analog front ends 200C3a and 200C3b is illustrated.

Each of the four nodes N11, N12, N21, and N22 may be represented using a first resistor R1, a second resistor R2, a first parasitic capacitor CB1, a second parasitic capacitor CB2, and a mutual capacitor CM. The first resistor R1 may be an equivalent resistor of a portion of one electrode 210, for example, such as a portion of the one electrode 210 where one node is defined. The second resistor R2 may be an equivalent resistor of a portion of one cross electrode 220, for example, a portion of the one cross electrode 220 where one node is defined. The first parasitic capacitor CB1 may be a capacitor between the one electrode 210 and a second electrode CE (e.g., refer to FIG. 4). The second parasitic capacitor CB2 may be a capacitor between the one cross electrode 220 and the second electrode CE (e.g., refer to FIG. 4). The mutual capacitor CM may be a capacitor between the one electrode 210 and the one cross electrode 220.

In a second mode, a sensor driving unit (e.g., a sensor driver) 200C may receive sensing signals SS from the electrodes 210 and the cross electrodes 220. The four nodes N11, N12, N21, and N22 of FIG. 6 may be defined by the two electrodes 210 and the two cross electrodes 220. Four sensing signals SS1, SS2, SS3, and SS4 received by the sensor driving unit 200C are illustrated as an example.

The first sensing signal SS1 may be received from the 1-1st node N11 and the one cross electrode 220 included in the 1-2nd node N12. The second sensing signal SS2 may be received from the 2-1st node N21 and another cross electrode 220 included in the 2-2nd node N22. The third sensing signal SS3 may be received from the 1-1st node N11 and the one electrode 210 included in the 2-1st node N21. The fourth sensing signal SS4 may be received from the 1-2nd node N12 and another electrode 210 included in the 2-2nd node N22.

An active input PNI by an input device PN (e.g., refer to FIG. 2) may occur at the 1-1st node N11. In other words, a touch event by the input device PN (e.g., refer to FIG. 2) may occur by overlapping with the 1-1st node N11. A downlink signal DLS may be output from the input device PN (e.g., refer to FIG. 2). A first touch capacitance CP1 may be generated between the one electrode 210 and the input device PN (e.g., refer to FIG. 2), and a second touch capacitance CP2 may be generated between the one cross electrode 220 and the input device PN (e.g., refer to FIG. 2).

When the active input PNI is generated, a noise input NI may be generated between the 2-1st node N21 and the 2-2nd node N22. The noise input NI may be provided by a large area conductor of one node size or more. For example, the noise input NI may be provided by a part of a palm or a part of an edge of the hand. A first noise capacitance CF1 may be formed between the large area conductor and the one electrode 210, and a second noise capacitance CF2 may be formed between the large area conductor and another electrode 210.

The first and second analog front ends 200C3a and 200C3b may be included in the sensor driving unit 200C. For example, the first and second analog front ends 200C3a and 200C3b may be included in the input detection circuit 200C3. The first analog front ends 200C3a may receive sensing signals from the cross electrodes 220, respectively. The second analog front ends 200C3b may receive sensing signals from the electrodes 210, respectively. Each of the first and second analog front ends 200C3a and 200C3b may include an operational amplifier and an AD converter 200C-1 (e.g., refer to FIG. 9B). For example, the operational amplifier may amplify each of the received first to four sensing signals SS1, SS2, SS3, and SS4, and the AD converter 200C-1 (e.g., refer to FIG. 9B) may covert the first to fourth sensing signals SS1 to SS4 into first to fourth digital signals, respectively.

Figure 8:
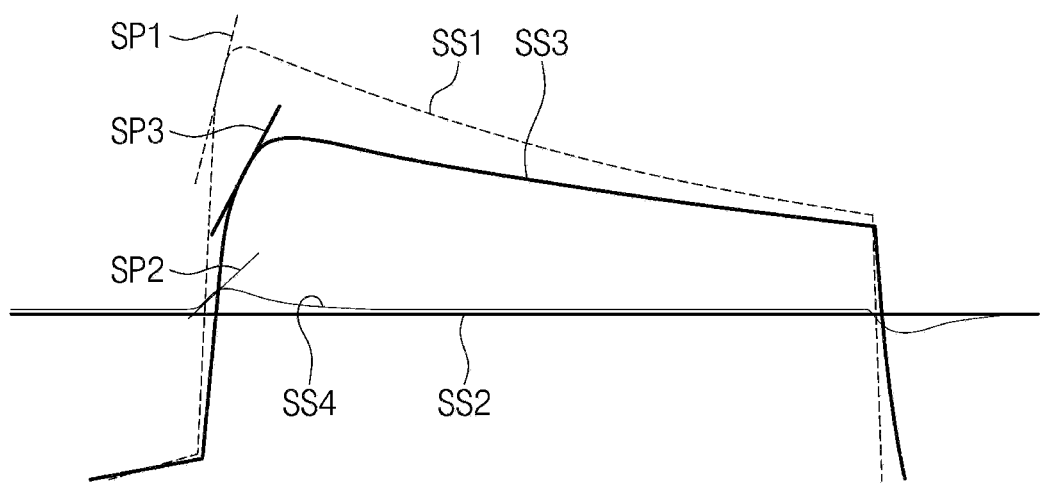
FIG. 8 illustrates waveforms of first to fourth sensing signals shown in FIG. 7.

FIG. 8 illustrates waveforms of the first to fourth sensing signals SS1 to SS4 shown in FIG. 7.

Referring to FIGS. 7 and 8, the first sensing signal SS1 and the third sensing signal SS3 may be valid signals by the active input PNI, and the fourth sensing signal SS4 may be a noise signal by the noise input NI.

A first slop SP1 of the first sensing signal SS1 and a third slope SP3 of the third sensing signal SS3 may be larger than a second slope SP2 of the fourth sensing signal SS4. The sensor driving unit 200C (e.g., refer to FIG. 6) may analyze waveform change rates of the first to fourth sensing signals SS1 to SS4 based on the slopes SP1, SP2, and SP3, and may separate a noise signal from the first to fourth sensing signals SS1 to SS4. Thus, a phenomenon where coordinates of the active input PNI are distorted by the noise input NI may be prevented or substantially prevented. This will be described in more detail below.

Figure 9A:
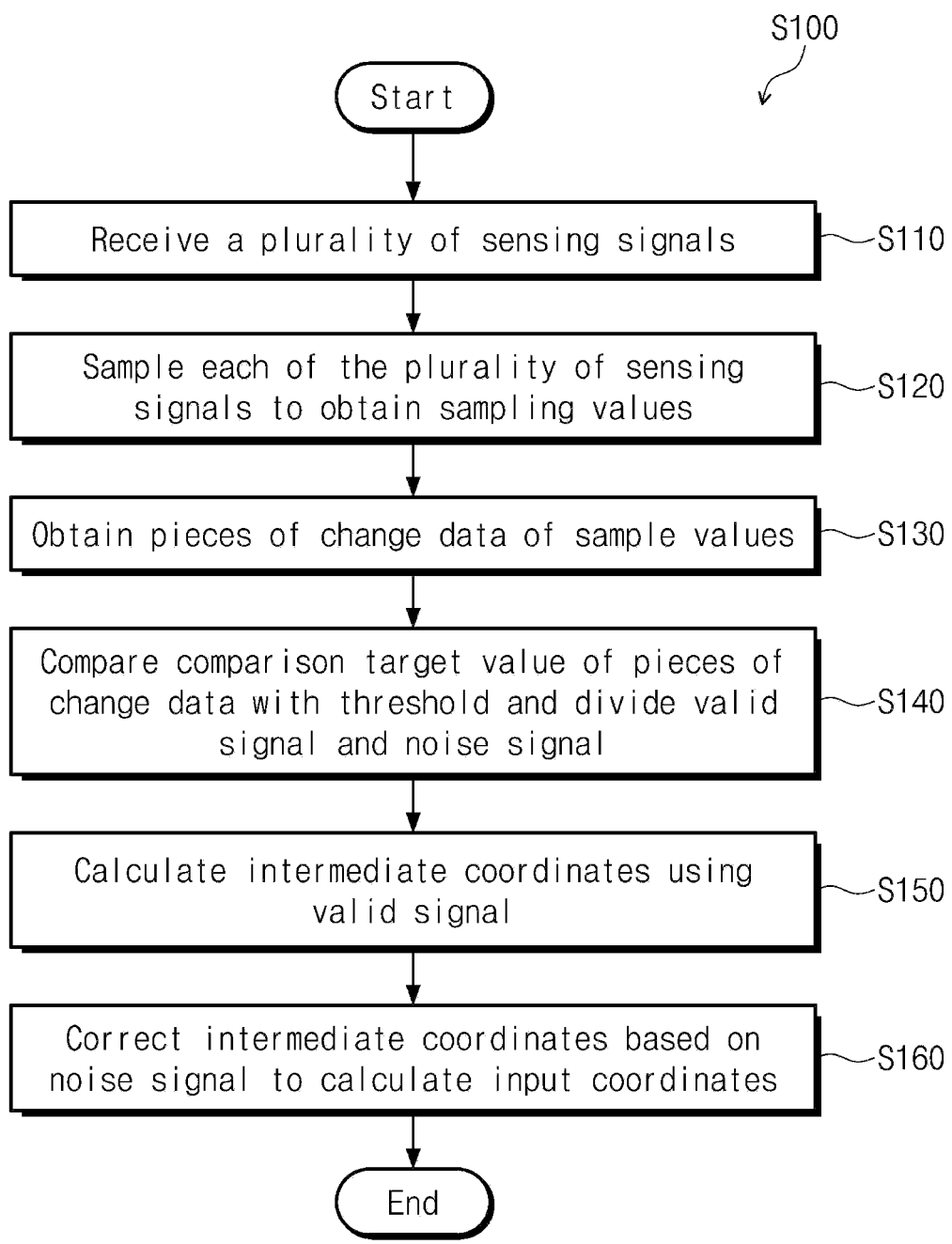
FIG. 9A is a flowchart of a driving method of an electronic device according to an embodiment of the present disclosure.
Figure 9B:
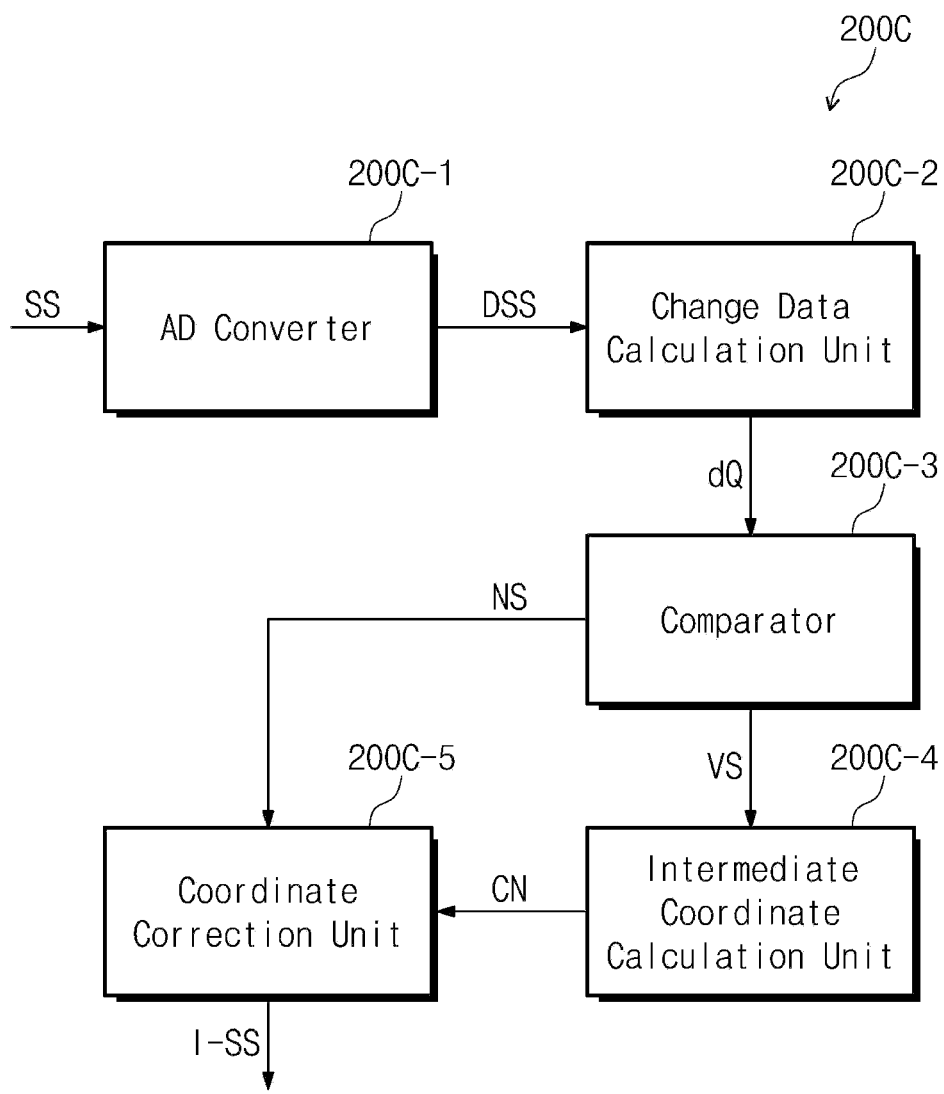
FIG. 9B is a block diagram of a sensor driving unit according to an embodiment of the present disclosure.
Figure 10:
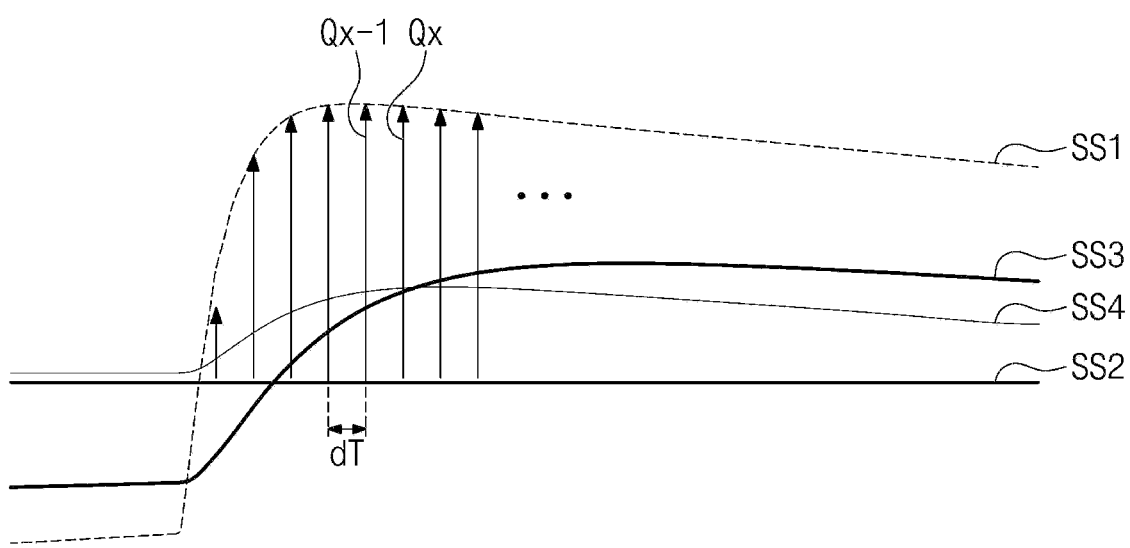
FIG. 10 illustrates a sampling operation of a first sensing signal in a second mode according to an embodiment of the present disclosure.

FIG. 9A is a flowchart of a driving method S100 of an electronic device according to an embodiment of the present disclosure. FIG. 9B is a block diagram of a sensor driving unit 200C according to an embodiment of the present disclosure. FIG. 10 illustrates a sampling operation of a first sensing signal SS1 in a second mode according to an embodiment of the present disclosure.

Referring to FIGS. 6, 7, 9A, and 9B, in operation S110, the sensor driving unit 200C may receive a plurality of sensing signals SS.

The sensor driving unit 200C may include an AD converter 200C-1, a change data calculation unit (e.g., a change data calculator) 200C-2, a comparator 200C-3, an intermediate coordinate calculation unit (e.g., an intermediate coordinate calculator) 200C-4, and a coordinate correction unit (e.g., a coordinate corrector) 200C-5. The AD converter 200C-1, the change data calculation unit 200C-2, the comparator 200C-3, the intermediate coordinate calculation unit 200C-4, and the coordinate correction unit 200C-5 of the sensor driving unit 200C may not be separate components that are divided physically. For example, the AD converter 200C-1, the change data calculation unit 200C-2, the comparator 200C-3, the intermediate coordinate calculation unit 200C-4, and the coordinate correction unit 200C-5 of the sensor driving unit 200C may be divided functionally according to their operations, which may be implemented in a single chip.

The AD converter 200C-1 may convert a plurality of sensing signals SS, each of which has an analog form, into digital signals. In operation S120, the AD converter 200C-1 may sample each of the plurality of sensing signals SS, using a selection sampling frequency higher than a reference sampling frequency, to obtain sampling values DSS. The reference sampling frequency may be referred to as a first sampling frequency, and the selection sampling frequency may be referred to as a second sampling frequency. The selection sampling frequency may be a frequency selected of a level capable of distinguishing a valid input from a noise input. For example, the selection sampling frequency may be selected of a level capable of comparing pieces of change data dQ, which will be described in more detail below, with a comparison target value, and distinguishing a valid signal VS from a noise signal NS.

Referring to FIG. 10, sampling of a first sensing signal SS1 may proceed at a first period dT in a second mode, and a plurality of sampling values DSS may be obtained from one sensing signal, for example, such as the first sensing signal SS1. Furthermore, the plurality of sampling values DSS may be obtained from each of the second to fourth sensing signals SS2 to SS4. Furthermore, sampling of a sensing signal SS (e.g., refer to FIG. 6) may also proceed at a selection sampling frequency in a first mode for detecting a passive input. However, the present disclosure is not particularly limited thereto. For example, sampling of a sensing signal SS (e.g., refer to FIG. 6) may proceed at a sampling frequency lower than the selection sampling frequency in the first mode.

In operation S130, the change data calculation unit 200C-2 may obtain pieces of change data dQ from the sampling values DSS. Each of the pieces of change data dQ may be calculated by a difference between sampling values Qx-1 and Qx that are adjacent to each other. For example, one piece of change data dQ may correspond to a difference between one sampling value Qx and a sampling value Qx-1 prior to the one sampling value Qx.

In operation S140, the comparator 200C-3 may compare a comparison target value of the pieces of change data dQ with a threshold, and may divide a valid signal VS from a noise signal NS. For example, digital signals corresponding to the first sensing signal SS1 and the third sensing signal SS3 may be determined as the valid signal VS, and digital signals corresponding to the second sensing signal SS2 and the fourth sensing signal SS4 may be determined as the noise signal NS.

The comparator 200C-3 may provide the valid signal VS to the intermediate coordinate calculation unit 200C-4. In S150, the intermediate coordinate calculation unit 200C-4 may calculate intermediate coordinates CN using (e.g., based on) the valid signal VS.

In operation S160, the coordinate correction unit 200C-5 may correct the intermediate coordinates CN based on the noise signal NS to calculate input coordinates. The coordinate correction unit 200C-5 may output a coordinate signal I-SS having input coordinate information. When an active input PNI is provided, as a noise input NI occurs together, some of the signals by the active input PNI may be abandoned to another channel. Thus, a certain error may occur when the center of gravity for the active input PNI is calculated based on only the valid signal VS. To correct it, the coordinate correction unit 200C-5 may derive coordinates and a size of a large area conductor based on the noise signal NS, and may correct the intermediate coordinates CN based on the coordinates and the size of the large area conductor.

According to an embodiment of the present disclosure, as the valid signal VS except for the noise signal NS is used in calculating the intermediate coordinates CN, a distortion of a position of an input device PN (e.g., refer to FIG. 2) may be reduced. Furthermore, after the intermediate coordinates CN are calculated using the valid signal VS, as the intermediate coordinates CN are corrected with regard to the noise signal NS, an error in calculating the center of gravity of the input device PN (e.g., refer to FIG. 2) by the large area conductor may be compensated. Thus, an electronic device 1000 (e.g., refer to FIG. 1), in which all of position accuracy, linearity, and accuracy of the input of the input device PN (e.g., refer to FIG. 2) are improved, may be provided.

Figure 11:
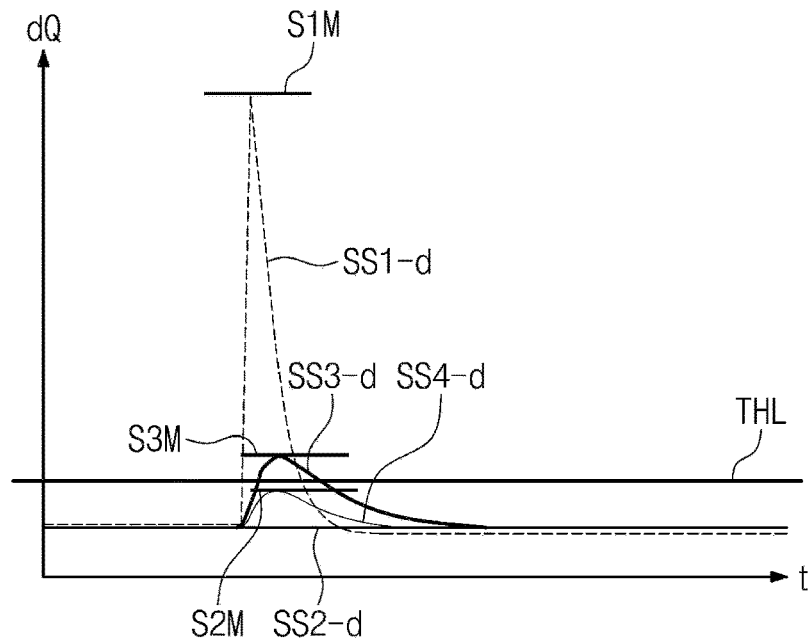
FIG. 11 is a graph illustrating pieces of change data and a threshold according to an embodiment of the present disclosure.

FIG. 11 is a graph illustrating pieces of change data dQ and a threshold THL according to an embodiment of the present disclosure.

Referring to FIGS. 7 and 11, first to fourth graphs SS1-*d*, SS2-*d*, SS3-*d*, and SS4-*d* corresponding to the first to fourth sensing signals SS1, SS2, SS3, and SS4, respectively, are illustrated in FIG. 11. Each of the first to fourth graphs SS1-*d*, SS2-*d*, SS3-*d*, and SS4-*d* is a graph illustrating pieces of change data dQ over time t.

A comparison target value of the pieces of change data dQ derived from each of the first to fourth sensing signals SS1, SS2, SS3, and SS4 may be a maximum value. A first maximum value S1M of the pieces of change data dQ of the first sensing signal SS1, a second maximum value S2M of the pieces of change data dQ of the fourth sensing signal SS4, and a third maximum value S3M of the pieces of change data dQ of the third sensing signal SS3 are shown in FIG. 11.

A comparator 200C-3 may compare each of the first maximum value S1M, the second maximum value S2M, and the third maximum value S3M with a threshold THL. Information about the threshold THL may be stored in a memory.

Because the first maximum value S1M and the third maximum value S3M are greater than or equal to the threshold THL, the comparator 200C-3 may determine the first sensing signal SS1 and the third sensing signal SS3 as a valid signal VS (e.g., refer to FIG. 9B). Because the second maximum value S2M is less than the threshold THL, the comparator 200C-3 may determine the fourth sensing signal SS4 as a noise signal NS (e.g., refer to FIG. 9B).

Figure 12:
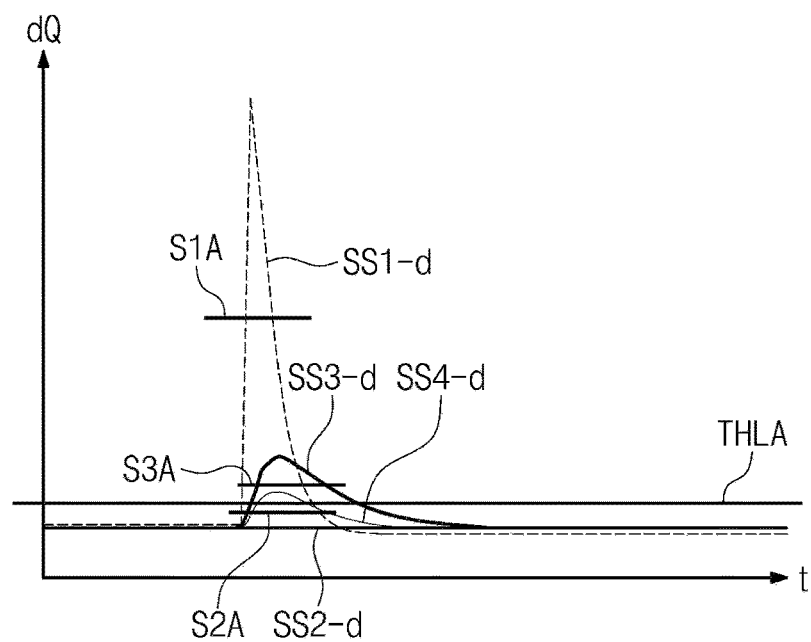
FIG. 12 is a graph illustrating pieces of change data and a threshold according to an embodiment of the present disclosure.

FIG. 12 is a graph illustrating pieces of change data dQ and a threshold THLA according to an embodiment of the present disclosure.

Referring to FIGS. 7 and 12, first to fourth graphs SS1-*d*, SS2-*d*, SS3-*d*, and SS4-*d* corresponding to first to fourth sensing signals SS1, SS2, SS3, and SS4, respectively, are illustrated in FIG. 12. Each of the first to fourth graphs SS1-*d*, SS2-*d*, SS3-*d*, and SS4-*d* is a graph illustrating pieces of change data dQ over time t.

A comparison target value of the pieces of change data dQ derived from each of the first to fourth sensing signals SS1, SS2, SS3, and SS4 may be an average value. A first average value S1A of the pieces of change data dQ of the first sensing signal SS1, a second average value S2A of the pieces of change data dQ of the fourth sensing signal SS4, and a third average value S3A of the pieces of change data dQ of the third sensing signal SS3 are shown in FIG. 12.

A comparator 200C-3 may compare each of the first average value S1A, the second average value S2A, and the third average value S3A with a threshold THLA. Because the first average value S1A and the third average value S3A are greater than or equal to the threshold THLA, the comparator 200C-3 may determine the first sensing signal SS1 and the third sensing signal SS3 as a valid signal VS (e.g., refer to FIG. 9B). Because the second average value S2A is less than the threshold THLA, the comparator 200C-3 may determine the fourth sensing signal SS4 as a noise signal NS (e.g., refer to FIG. 9B).

Separating the noise signal based on the maximum value in FIG. 11 or based on the average value in FIG. 12 is described as an example, but the present disclosure is not limited thereto. For example, the comparator 200C-3 may compare a root mean square of the pieces of change data dQ with a threshold to divide a noise signal and a valid signal.

Figure 13A:
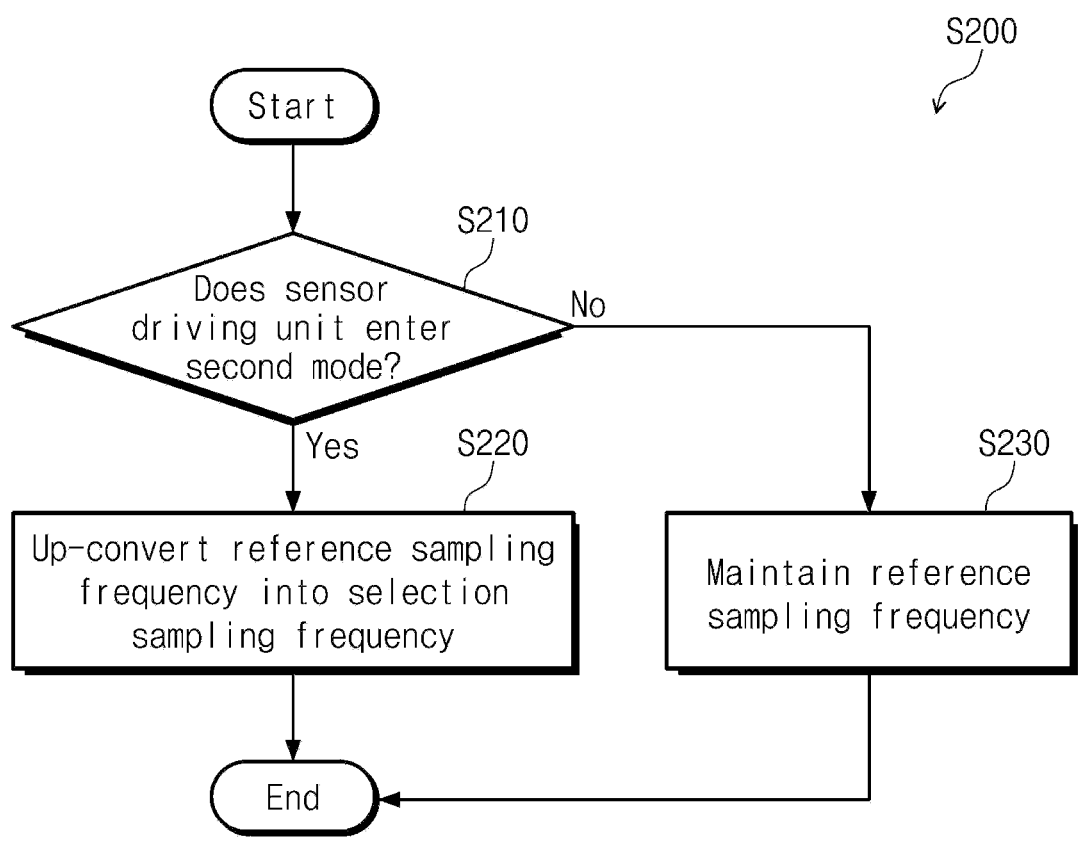
FIG. 13A is a flowchart of a driving method of an electronic device according to an embodiment of the present disclosure.
Figure 13B:
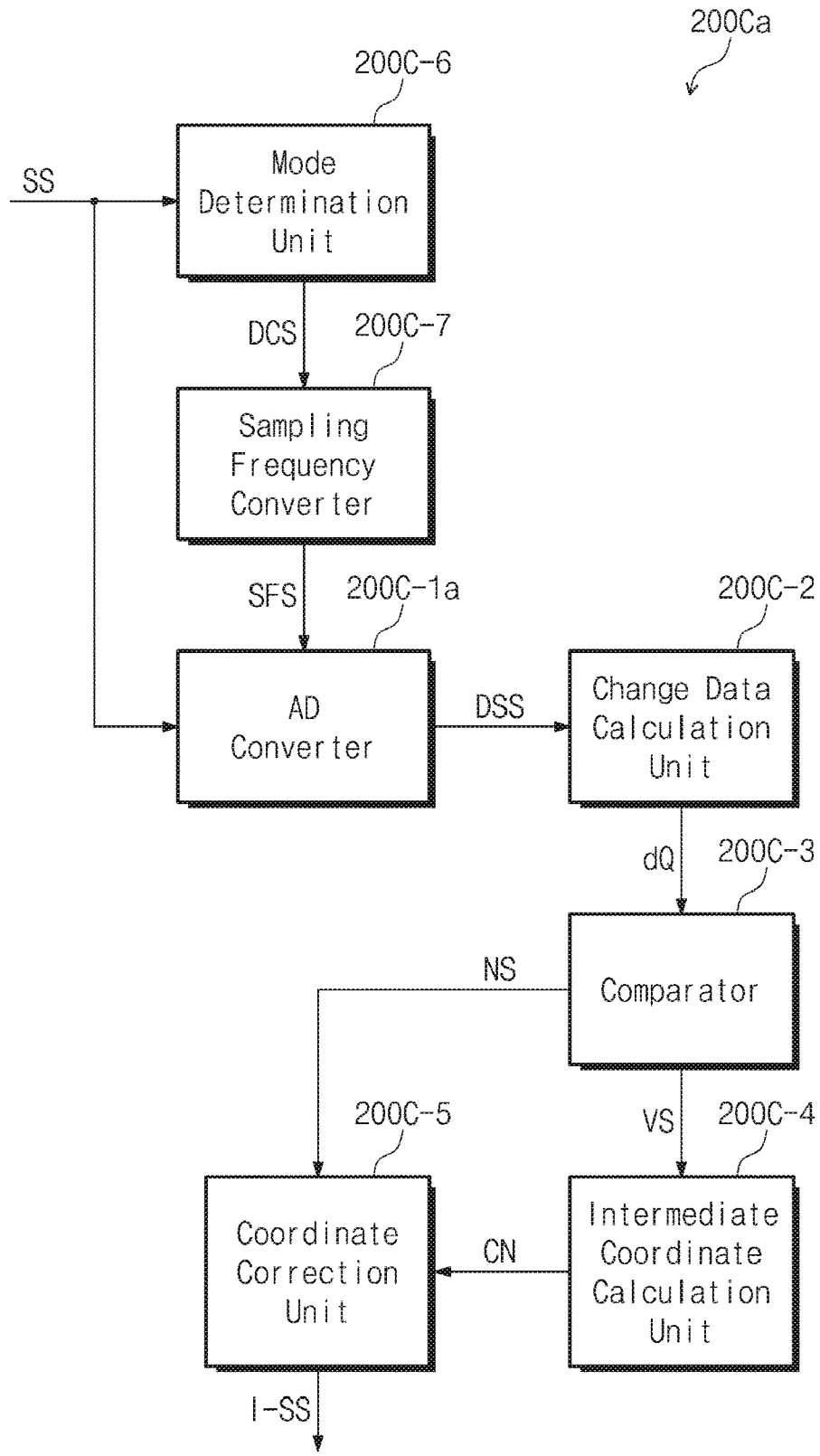
FIG. 13B is a block diagram of a sensor driving unit according to an embodiment of the present disclosure.

FIG. 13A is a flowchart of a driving method S200 of an electronic device according to an embodiment of the present disclosure. FIG. 13B is a block diagram of a sensor driving unit 200Ca according to an embodiment of the present disclosure.

Referring to FIGS. 6, 13A, and 13B, the sensor driving unit 200Ca may further include a mode determination unit (e.g., a mode determiner) 200C-6 and a sampling frequency converter 200C-7.

The mode determination unit 200C-6 may determine whether a sensor layer 200 and the sensor driving unit 200Ca are driven in any of a first mode or a second mode. In operation S210, the mode determination unit 200C-6 may determine whether the sensor driving unit 200Ca enters the second mode.

When it is determined that the sensor driving unit 200Ca enters the second mode (e.g., YES at S210), the mode determination unit 200C-6 may provide a frequency conversion signal DCS to the sampling frequency converter 200C-7. The mode determination unit 200C-6 may determine whether the sensor driving unit 200Ca enters the second mode based on a sensing signal SS, or may determine whether the sensor driving unit 200Ca enters the second mode based on a mode determination signal. For example, a response signal output from an input device PN (e.g., refer to FIG. 2) in response to an uplink signal may be included in the sensing signal SS, and the mode determination unit 200C-6 may determine whether the sensor driving unit 200Ca enters the second mode based on the response signal.

In operation S220, the sampling frequency converter 200C-7 may up-convert a reference sampling frequency into a selection sampling frequency. The sampling frequency converter 200C-7 may provide the AD converter 200C-1a with a sampling frequency signal SFS including information about a sampling frequency.

When it is determined that the sensor driving unit 200Ca does not enter the second mode (e.g., NO at S210), in operation S230, the sampling frequency converter 200C-7 may maintain the reference sampling frequency without change.

Figure 14:
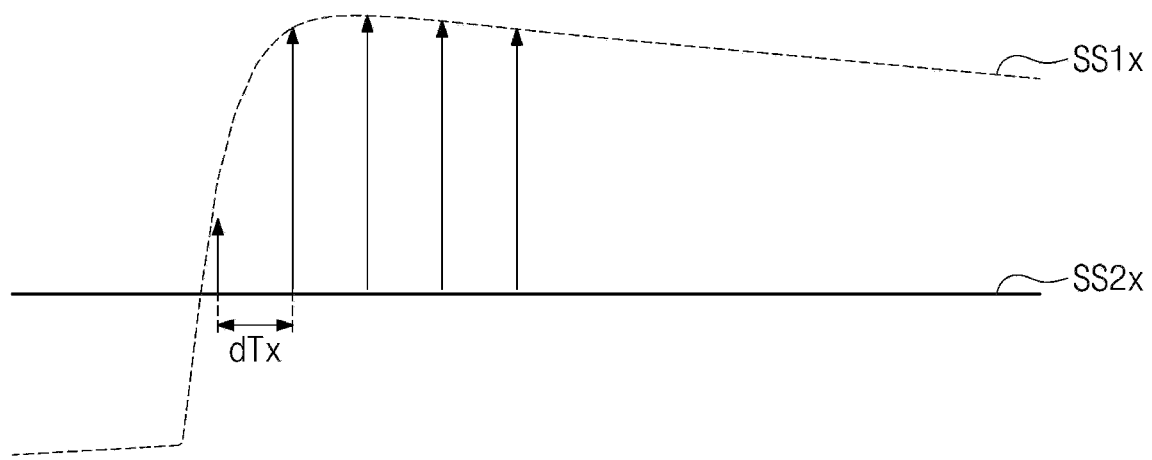
FIG. 14 illustrates a sampling operation of a first sensing signal in a first mode according to an embodiment of the present disclosure.

FIG. 14 illustrates a sampling operation of a first sensing signal SS1x in a first mode according to an embodiment of the present disclosure.

Referring to FIGS. 7 and 14, when the sensor layer 200 and the sensor driving unit 200C operate in a first mode, the sensor driving unit 200C may receive sensing signals SS1x and SS2x from cross electrodes 220. An AD converter 200C-1a may sample each of the sensing signals SS1x and SS2x at a basic sampling frequency. For example, the basic sampling frequency may be lower than a selection sampling frequency in a second mode. Thus, a second period dTx may be longer than a first period dT (e.g., refer to FIG. 10). In other words, sampling may proceed at the second period dTx in the first mode, and a plurality of sampling values DSS may be obtained from one sensing signal, for example, such as the first sensing signal SS1x. The sensor driving unit 200C may calculate position coordinates based on the plurality of sampling values DSS, and may provide the main driving unit 1000C (e.g., refer to FIG. 2) with a coordinate signal I-SS.

According to an embodiment, sampling may proceed at the basic sampling frequency, which is a relatively low frequency, in the first mode, and sampling may proceed at the selection sampling frequency, which is a relatively high frequency, in the second mode. Thus, as compared to a case when sampling proceeds at the selection sampling frequency in both the first mode and the second mode, power consumption may be reduced.

According to one or more embodiments of the present disclosure described above, in calculating intermediate coordinates for an active input provided from an input device, a distortion for a position of the input device may be reduced, as a valid signal except for a noise signal is used. Furthermore, after the intermediate coordinates are calculated using the valid signal, as the intermediate coordinates are corrected with regard to the noise signal, an error in calculating the center of gravity of the input device by a large area conductor may be compensated for. Thus, an electronic device, in which all of position accuracy, linearity, and accuracy of the input of the input device are improved, may be provided.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. An electronic device, comprising:
   a display layer configured to display an image;
   a sensor layer on the display layer; and
   a sensor driver electrically connected with the sensor layer, and configured to be selectively driven in a first mode for detecting a passive input, or a second mode for detecting an active input,
   wherein, in the second mode, the sensor driver is configured to:
      receive a plurality of sensing signals from the sensor layer;
      divide the plurality of sensing signals into a valid signal and a noise signal;
      calculate intermediate coordinates based on the valid signal; and
      correct the intermediate coordinates based on the noise signal to calculate input coordinates.

2. The electronic device of claim 1, wherein the sensor driver comprises:
   an analog-to-digital (AD) converter configured to sample each of the plurality of sensing signals at a sampling frequency to obtain sampling values.

3. The electronic device of claim 2, wherein the sensor driver further comprises:
   a change data calculator configured to obtain pieces of change data of the sampling values in the second mode;
   a comparator configured to compare a comparison target value of the pieces of change data of each of the plurality of sensing signals with a threshold, and divide the plurality of sensing signals into the valid signal and the noise signal;
   an intermediate coordinate calculator configured to calculate the intermediate coordinates based on the valid signal; and
   a coordinate corrector configured to correct the intermediate coordinates based on the noise signal to calculate the input coordinates.

4. The electronic device of claim 3, wherein each of the pieces of change data corresponds to a difference between one sampling value and a previous sampling value prior to the one sampling value.

5. The electronic device of claim 3, wherein the plurality of sensing signals include a first sensing signal and a second sensing signal,
   wherein the comparator is configured to determine the first sensing signal as the valid signal when a maximum value of the pieces of change data of the first sensing signal is greater than or equal to the threshold, and wherein the comparator is configured to determine the second sensing signal as the noise signal when a maximum value of the pieces of change data of the second sensing signal is less than the threshold.

6. The electronic device of claim 3, wherein the plurality of sensing signals include a first sensing signal and a second sensing signal,
wherein the comparator is configured to determine the first sensing signal as the valid signal when an average value of the pieces of change data of the first sensing signal is greater than or equal to the threshold, and
wherein the comparator is configured to determine the second sensing signal as the noise signal when an average value of the pieces of change data of the second sensing signal is less than the threshold.

7. The electronic device of claim 3, wherein the plurality of sensing signals include a first sensing signal and a second sensing signal,
wherein the comparator is configured to determine the first sensing signal as the valid signal when a root mean square of the pieces of change data of the first sensing signal is greater than or equal to the threshold, and
wherein the comparator is configured to determine the second sensing signal as the noise signal when a root mean square of the pieces of change data of the second sensing signal is less than the threshold.

8. The electronic device of claim 3, wherein the sensor driver further comprises:
a mode determiner configured to determine a driving mode of the sensor driver between the first mode and the second mode; and
a sampling frequency converter configured to change the sampling frequency from a reference sampling frequency to a selection sampling frequency higher than the reference sampling frequency, when the sensor driver is driven in the second mode.

9. The electronic device of claim 2, wherein the sampling frequency is a reference sampling frequency in the first mode, and
wherein the sampling frequency is a selection sampling frequency higher than the reference sampling frequency in the second mode.

10. The electronic device of claim 2, wherein the sampling frequency is a selection sampling frequency in the first mode, and
wherein the sampling frequency is the same as the selection sampling frequency in the second mode.

11. The electronic device of claim 1, wherein the sensor layer comprises a plurality of cross electrodes extending along a first direction, and a plurality of electrodes extending along a second direction crossing the first direction, and
wherein the sensor driver is configured to:
detect the passive input by means of a change in mutual capacitance formed between the plurality of electrodes and the plurality of cross electrodes in the first mode; and
detect the active input by means of a change in capacitance of at least one of the plurality of electrodes and the plurality of cross electrodes in the second mode.

12. An electronic device, comprising:
a sensor layer comprising a plurality of cross electrodes extending along a first direction, and a plurality of electrodes extending along a second direction crossing the first direction; and
a sensor driver electrically connected with the sensor layer,
wherein the sensor driver is configured to:
receive a plurality of sensing signals from the plurality of electrodes and the plurality of cross electrodes;
sample each of the plurality of sensing signals at a selection sampling frequency higher than a reference sampling frequency to obtain sampling values;
divide the plurality of sensing signals into a valid signal and a noise signal based on pieces of change data calculated by a difference between sampling values adjacent to each other from among the sampling values; and
calculate intermediate coordinates based on the valid signal.

13. The electronic device of claim 12, wherein the sensor driver is configured to:
compare a comparison target value of any one of a maximum value, an average value, or a root mean square of the pieces of change data with a threshold;
determine a sensing signal corresponding to the pieces of change data from among the plurality of sensing signals as the valid signal when the comparison target value is greater than or equal to the threshold; and
determine the sensing signal as the noise signal when the comparison target value is less than a threshold.

14. The electronic device of claim 12, wherein the sensor driver is configured to correct the intermediate coordinates based on the noise signal to calculate input coordinates.

15. The electronic device of claim 12, wherein the sensor driver is configured to be selectively driven in a first mode for detecting a passive input, or a second mode for detecting an active input, and
wherein the reference sampling frequency is a sampling frequency in the first mode, and the selection sampling frequency is the sampling frequency in the second mode.

16. The electronic device of claim 15, wherein the sensor driver is configured to:
detect the passive input by means of a change in mutual capacitance formed between the plurality of electrodes and the plurality of cross electrodes in the first mode; and
detect the active input by means of a change in capacitance of each of the plurality of electrodes and the plurality of cross electrodes in the second mode.

17. The electronic device of claim 12, wherein the sensor driver is configured to be selectively driven in a first mode for detecting a passive input, or a second mode for detecting an active input, and
wherein the selection sampling frequency is a sampling frequency in the first mode and the second mode.

18. A driving method of an electronic device, comprising:
receiving a plurality of sensing signals from a sensor layer comprising a plurality of cross electrodes extending along a first direction, and a plurality of electrodes extending along a second direction crossing the first direction;
sampling each of the plurality of sensing signals at a selection sampling frequency higher than a reference sampling frequency to obtain a plurality of sampling values;
comparing sampling values adjacent to each other from among the plurality of sampling values to calculate a plurality of pieces of change data;
comparing a comparison target value derived from the plurality of pieces of change data with a threshold, and dividing the plurality of sensing signals into a valid signal and a noise signal;

calculating intermediate coordinates based on the valid signal; and correcting the intermediate coordinates based on the noise signal to calculate input coordinates.

19. The driving method of claim 18, further comprising:

determining a driving mode between a first mode for detecting a passive input, and a second mode for detecting an active mode, wherein the sensor layer:
- receives a plurality of first mode sensing signals from the plurality of electrodes or the plurality of cross electrodes when the sensor layer operates in the first mode;
- samples the plurality of first mode sensing signals at the reference sampling frequency; and
- calculates first mode input coordinates according to the passive input based on the sampled plurality of first mode sensing signals.

20. The driving method of claim 19, further comprising:

up-converting the reference sampling frequency into the selection sampling frequency when the sensor layer operates in the second mode.

\* \* \* \* \*